(12) United States Patent
Turk et al.

(10) Patent No.: US 6,271,776 B1
(45) Date of Patent: Aug. 7, 2001

(54) SELECTIVELY REMOVING SEQUENCES FROM AN ENUMERATIVE MODULATION CODE

(75) Inventors: Stephen Alan Turk; Christopher Paul Zook, both of Longmont, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/451,392

(22) Filed: Nov. 30, 1999

(51) Int. Cl.[7] ..................................... H03M 7/00
(52) U.S. Cl. .............................. 341/95; 341/106
(58) Field of Search .................... 341/95, 50, 87, 341/51, 106

(56) References Cited

U.S. PATENT DOCUMENTS 5,608,396 * 3/1997 Cheng ..................................... 341/95
5,907,297 * 5/1999 Cohen .................................... 341/95

OTHER PUBLICATIONS

Mansuripur, "Enumerative Modulation Coding with Arbitrary Constraints and Post–Modulation Error Correction Coding for Data Storage Systems", vol. 1499, *Optical Data Storage*, SPIE, 1991, pp. 76–86.

* cited by examiner

*Primary Examiner*—Brian Young
(74) *Attorney, Agent, or Firm*—Dan Shifrin (57) ABSTRACT

An encoder/decoder (ENDEC) avoids undesired sequences in encoded data blocks, such as quasi-catastrophic sequences, by essentially skipping over inputs that create the undesired sequences. Upon recognizing that a particular incoming data block has a value corresponding to an undesired sequence, the ENDEC does not use the problematic value for the incoming data block, but rather adds an offset to the value for the incoming data block, and uses the offset value for producing an encoded output sequence for the data block.

43 Claims, 6 Drawing Sheets

SELECTIVELY REMOVING SEQUENCES FROM AN ENUMERATIVE MODULATION CODE

BACKGROUND

1. Field of the Invention

The present invention pertains to encoding and decoding of data for transmission to/from a recording medium or over a data channel.

2. Related Art and Other Considerations

A challenge in the design and operation of encoders and decoders is minimizing the size and complexity of logic circuitry and/or memory utilized thereby. In this regard, the encoding and decoding of large blocks of data should be relatively fast so as not to impede the transmission of data over a data channel, or the transducing of data (e.g., reproduction or recording of data) relative to a storage medium, such as a rotating disk medium (e.g., magnetic disk or optical disk), for example.

One existing technique for encoding and decoding data is enumerative coding combined with a trellis scheme. A trellis is made from a state diagram that describes the code, and is formed over time as showing how many paths emanate from a node to a final state. An example of such technique is described by Mansuripur, "Enumerative Modulation Coding With Arbitrary Constraints and Post-Modulation Error Correction Coding For Data Storage Systems," *SPIE*, Vol. 1499, *Optical Data Storage*, 1991, pp. 72–86. Basically, for encoding according to such a technique, one views an entire block of data (e.g., 17 bits for a 17/18 encoding scheme) as an integer. The integer is utilized as a starting point for working through a trellis, comparing the starting point integer and modifying the integer as necessary along the way through the trellis. At each point along the trellis, one output bit of the encoded codeword is produced.

Enumerative coding combined with a trellis scheme is particularly applicable to a Quadbit mod 2 code. A Quadbit mod 2 code allows quadbits (four consecutive NRZI transitions) on every other bit position. As referenced herein, bits of an encoded codeword or data block are labeled starting with the length of the block minus one, and descending down to zero. Using this numbering convention, quadbits are allowed to start on even numbered bits. When the length of each block is even, quadbits start on even-numbered bits and end on odd-numbered bits. The quadbit constraint does not allow runs of longer than four transitions in any codeword (i.e., data block).

Figure 8:
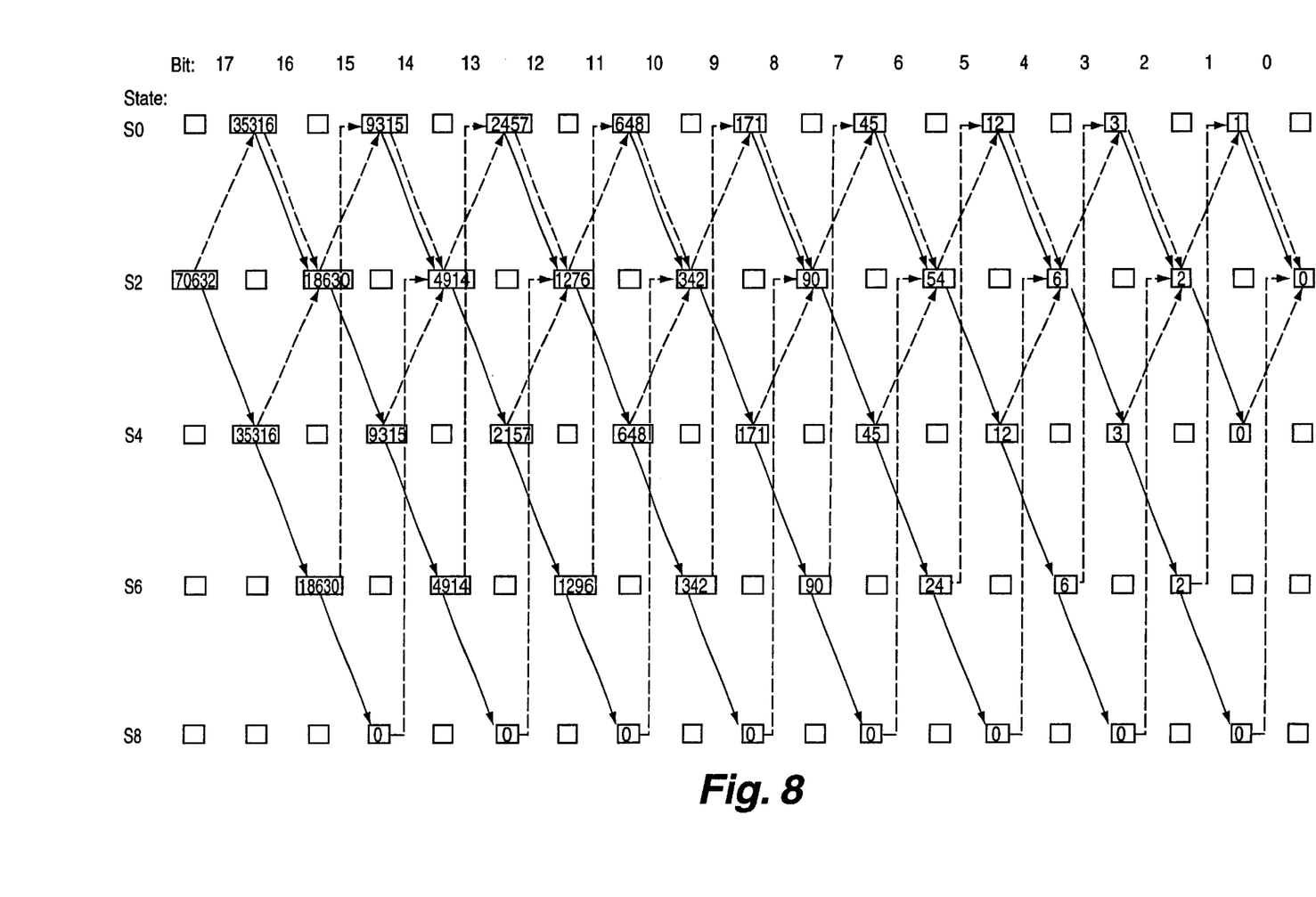
FIG. 8 is a diagrammatic view of a trellis for a 17/18 block code.

As an example of encoding using enumerative coding in combination with a trellis scheme, consider an incoming 17/18 data block which, when viewed as an integer, has the value 68506. The incoming data block thus has 17 bits, and is to be encoded to an 18 bit value. The trellis of FIG. 8 is applicable to a 17/18 encoder/decoder, and shows the bit positions 17 through 0 arranged in columns and various even numbered states S0 through S8 arranged in rows. The incoming data block (i.e., integer value 68506) is first compared with the first value in the trellis, specifically the value 70632 in bit position 17, state S2. Since 68506 is less than 70632, the technique follows the upper path in the trellis, ending at state S0 (as indicated by the dashed line). Since the upper path indicated by a dashed line is utilized, the technique outputs a NRZI 0 (zero) bit as the first bit of the 17/18 encoded output string. Next, the value 68506 is compared with the number associated with the trellis position to which the upper path led, namely bit position 16, state S0. The value 35316 is at bit position 16, state S0, which means that the value 68506 is compared with 35316. The value 68506 is greater than or equal to 35316, with the result that the technique follows the lower path (i.e., the solid line path) to bit position 15, state S2. Since a solid line path is taken, the technique outputs a NRZI 1 (one) value. Moreover, since a solid line path was taken, the technique subtracts 35316 from 68506, resulting in a new value 33190 to be used for the next comparison. Then, as the next comparison, the new value 33190 is compared with the value at bit position 15, state S2 (i.e., 18630). Since 33190 is greater than or equal to 18630, the technique follows the lower path, generating a NRZI 1, and does another subtraction.

The technique thus continues in the foregoing manner, until the entire trellis is traversed. At each point of the trellis, a comparison is made. If, in the comparison, the operative input value is greater than or equal to the trellis position value, the lower path (solid line) is followed with the result that a NRZI 1 value is generated and a subtraction is performed. On the other hand, if the operative input value is less than the trellis value, the upper path (dashed line) is followed with the result that a NRZI 0 value is generated and no subtraction is performed. When a trellis state is reached that has only one path leaving it, the encoder must follow such path, with no comparison or subtraction being performed. For the representative incoming 17/18 data block having the integer value 68506 utilized for the example above, the output sequence is 011110000111100001.

In the trellis scheme enumerative coding technique described above, the same trellis is used for a decoding operation in an essentially reverse procedure from the encoding operation. In decoding, however, an integer is built up (representing the decoded word) rather than taking apart an integer to create an encoded word, as occurs during encoding. In decoding, the decoded data integer is first initialized to zero. Then, the technique follows the trellis according to the dashed and solid lines. If the first bit of the sequence to be decoded is a NRZI 1, the number shown at the state from which the line leads (i.e., the state in which the compare is performed) is added to the decoded word integer. On the other hand, if the first bit of the sequence to be decoded is a NRZI 0, no addition is performed. The decoding technique then moves to the next state of the trellis, and either adds or ignores the value associated with the state in accordance with whether the bit to be decoded is a NRZI 0 or NRZI 1. The final summation after traversing the entire trellis is the decoded data block or data word.

In general it is desirable to keep trellis size to a minimum. This is equivalent to desiring the original state transition diagram to have as few states as possible. But the more constraints a code has, the more states its transition diagram is likely to have. In fact, while a QM2 (quadbit mod 2) code can be described with five states, these states only enforce the quadbit constraint. They neither enforce a runlength constraint, nor a quasi-catastrophic constraint. Adding a runlength constraint can be accomplished by adding a number of states equal to the desired runlength minus one. For example, a runlength constraint of 9 can be added to the QM2 code to get a state transition diagram with 13 states. However, this more than doubles the number of states, and there are still quasi-catastrophic sequences which should be removed. Also, the comparison numbers in the trellis lose some symmetry when adding a runlength constraint, which also increases implementation complexity.

Some particular sequences of bits, such as quasi-catastrophic sequences alluded to above, should be avoided for encoding and decoding. Examples of quasi-catastrophic sequences are an all-zeroes sequence, an all-ones sequence, and any sequence which has a continuous run of an even number of zeros followed by an even number of ones (zeros and ones, in the present discussion, being in NRZI representation). In order to avoid the problems attending such sequences, these sequences are normally coded out so that a detector does not have to deal with them. Coding out of the undesirable sequences involves special trellis considerations that makes the trellis larger and introduces other problems. Thus, a typical enumerative coding technique in combination with a trellis scheme, such as that described above, does not lend itself easily to removing such undesirable sequences.

What is needed, therefore, and an object of the present invention, is an encoding and decoding technique which effectively keeps a state diagram small for a code while providing advantages such as reducing runlength and removing quasi-catastrophic sequences without undue complication of the encoder and decoder structure.

BRIEF SUMMARY OF THE INVENTION

An encoder/decoder (ENDEC) avoids undesired sequences in encoded data blocks, such as quasi-catastrophic sequences, by essentially skipping over inputs that create the undesired sequences. Upon recognizing that a particular incoming data block has an value corresponding to an undesired sequence, the ENDEC does not use the problematic value for the incoming data block, but rather adds an offset to the value for the incoming data block, and uses the offset value for producing an encoded output sequence for the data block.

An encoder portion of the ENDEC receives incoming data blocks and generates output data sequences. The encoder avoids generating undesirable output data sequences by mapping undesirable or problematic incoming input values, as well as incoming input values greater than the undesirable incoming values, to corresponding modified or offset input values. The undesirable or problematic input values represent incoming data block which (without the mapping) would be encoded to an undesirable output data sequence. The encoder comprises an Add Offset Unit which obtains an offset value for the incoming data block and adds the offset value to the incoming data block to obtain the offset input value or modified input value. The offset input value is applied to an encoder main stage. The encoder main stage encodes the offset input value to obtain the output data sequence.

A decoder portion of the ENDEC comprises a decoder main stage which receives an encoded data sequence and generates therefrom an at least partially decoded sequence. The decoder portion also includes a remove offset unit which removes an offset value from the partially decoded sequence to form a decoded codeword (the offset value having been included to avoid encoding to an undesirable data sequence).

Various embodiments of circuitry and logic suitable for both encoders and decoders are disclosed. The first embodiment has an add or remove offset unit which includes a look up table. The lookup table receives an input value (either an incoming data block for the encoder or a partially decoded sequence for the decoder) as an address and outputs one of (1) the offset value for the input value, and (2) a sum or difference of the offset value and the input value (for the encoder and decoder, respectively).

In the second and third embodiments, an offset value is built up as bits of the incoming data block (for encoding) or partially decoded sequence (for decoding) are sequentially received. The second embodiment comprises an Offset Table Unit and a Stop Table Unit. The Offset Table Unit receives the following two inputs: (1) a bit position value; (2) a selected value which is selected to be one of a previous output of the Offset Table Unit and a previous input to the Offset Table Unit, depending on a current bit value. The Stop Table Unit generates a finished signal when the selected value reaches the offset value for input value, the Stop Table Unit receiving as inputs the bit position value, the selected value, and the current bit value.

The third embodiment comprises an offset unit which receives the following three inputs: (1) a bit position value; (2) a current bit value; and (3) a current offset value. The offset unit of the third embodiment uses the three inputs to generate a new offset value.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well known devices, circuits, and methods are omitted so as not to obscure the description of the present invention with unnecessary detail.

The present invention avoids undesired sequences in encoded data blocks, such as quasi-catastrophic sequences, by essentially skipping over inputs that create the undesired sequences. In other words, the encoder of the present invention, recognizing a particular incoming data block has an input value which, if encoded, would yield an undesired sequence, does not use the problematic input value for the incoming data block. Rather than use the problematic input value for the incoming data block, the encoder of the present invention adds an offset to the input value for the incoming data block, and uses the offset input value for producing an encoded output sequence for the data block. The offset is also added to incoming data blocks having greater input values than the problematic input value.

To illustrate the offset technique of the present invention, assume in the example discussed in the background that the integer value 68506 were the lowest problematic value (e.g., the smallest value which leads to an undesired sequence) involved for a particular coding scheme. In such case, all input data blocks less than 68506 encode to a "safe" codeword or output sequence for which the corresponding output sequence is not undesirable. But for input data blocks having integer values equal to or greater than 68506, the encoder of the present invention adds an offset value of at least "1" to the integer corresponding to the input data block. In view of the utilization of the offset, the present invention does not generate an undesirable output sequence. Thus, the offset technique is utilized by the encoder/decoder of the present invention for removing quasi-catastrophic sequences and other undesired sequences (such as those that cause a long runlength).

The offset encoding technique of the present invention can be implemented in various ways. One way is to prepare an elimination list of incoming data blocks which give rise to undesirable output sequences, and to order such elimination list sequentially. Then a word can be encoded in accordance with the steps shown in FIG. 1. At step 1-1, any initial offset is added to the incoming data block. At step 1-2, the result of step 1-1 is compared with the next value in the elimination list (which will be the first value in the elimination list for the first iteration). If the result of step 1-1 is less than the first word in the elimination list, no offset is added to the incoming data block and the new result is used as the modified integer value (as reflected by step 1-3). However, if the result of step 1-1 is not less than the first word in the elimination list, the value "1" is added at step 1-4 to the incoming data block to obtain a new result representing the incoming data block. After completion of step 1-4, step 1-2 is repeated by comparing the new result with the next value in the elimination list (which will be the second value on the elimination list for the second iteration). Whenever the result of a comparison is less than the next value on the elimination list, the offset determination procedure is completed, and (as represented by step 1-3) the new result as obtained at that point is utilized in the encoding procedure.

For decoding a sequence which has been encoded using the offset technique of FIG. 1, the sequence is first decoded, after which the offset is removed in a manner it which is understood from the principles described with reference to FIG. 1, with subtraction replacing addition.

As explained subsequently, the encoder and decoder of the present invention utilize an Offset Table. A simplified version of one embodiment of an Offset Table compatible with the technique of FIG. 1, and provided only for illustration purposes, is shown in Table 1. In the illustration of Table 1, the incoming data block has a length of n bits, with n=4. The acceptable values of incoming data blocks are shown in the DATA column of Table 1. It so happens that the undesirable incoming data block values, listed in the ELIMINATION LIST column of Table 1, are the four inputs 0000, 0110, 0111, and 1001. Table 1 is formatted to show the relationship between the elimination list and the input data after an offset has been added. The acceptable incoming data block values are mapped to the values in the MODIFIED DATA column in the same row of Table 1. An offset between any particular incoming data block and its modified data value is shown in the CURRENT OFFSET column of Table 1.

Figure 1:
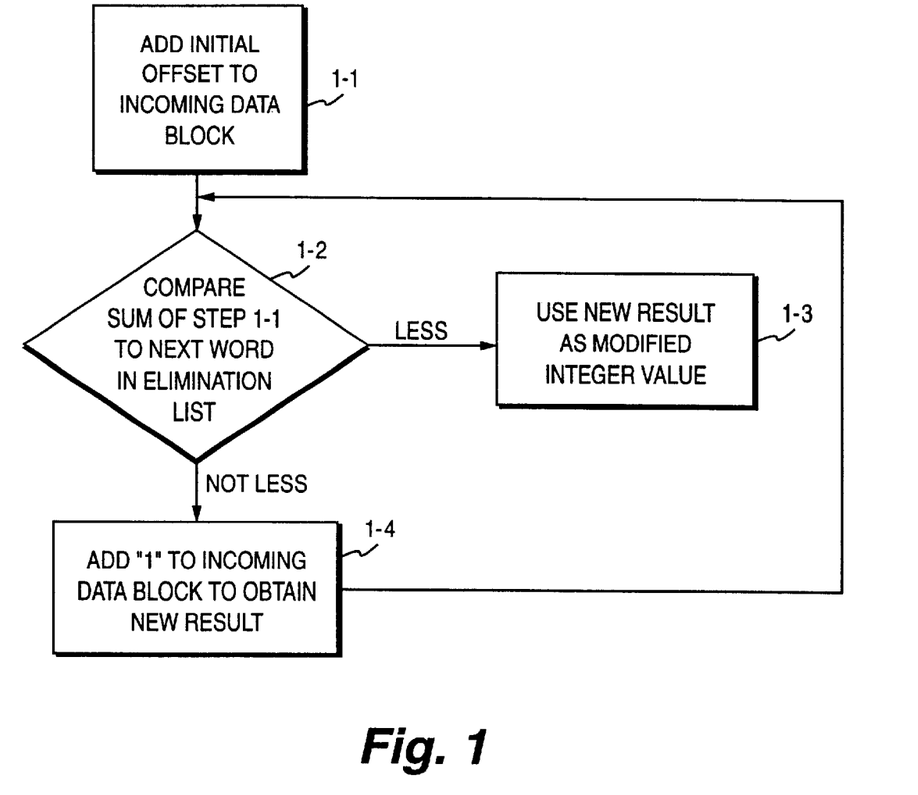
FIG. 1 is a flowchart showing basic steps employed by an encoer of an embodiment of the present invention.

For a specific example of encoding using the steps of FIG. 1 and Table 1, suppose that the incoming data block is represented by the integer value 6. At step 1-1, the initial offset of 1 is added to the incoming data block, yielding a resultant integer value of 7. Then, at step 1-2 the resultant integer value (7) is compared to the next value in the elimination list, i.e., 6 (0110). Since 7 is not less than 6, at step 1-4 the resultant integer value is incremented to 8. Then, at step 1-2 the resultant integer value 8 is compared with the next value in the elimination list, i.e., 7 (0111). Since it is determined at step 1-2 that 8 is not less than 7, at step 1-4 the resultant integer value is again incremented, yielding a new resultant integer value of 9. Looping back to step 1-2, it is determined that the new resultant integer value of 9 is not less than the next value in the elimination list, i.e., 9 (1001). Accordingly, at step 1-4 the resultant integer value is again incremented, this time to 10. At step 1-2 the new resultant integer value 10 is seen to be less than the next value in the elimination list (since there are no more values in the elimination list). Therefore, at step 1-3 the value 10 is assigned as the modified integer value (e.g., offset input value) for the integer 6. The offset input value 10 is then subjected to the enumerative encoding as above described with respect to FIG. 8.

The encoding technique of FIG. 1, and its converse decoding technique, require repeated comparisons with potentially large numbers (particularly considering that typically the number of bits n is much greater than 4). Such repeated comparisons are not efficient in hardware circuitry.

It will be seen above that Table 1 has three different Current Offset values: 0001; 0011; and 0100. For sake of the ensuing discussion, the alphabetical letter A is assigned to Current Offset value 0001 (i.e., the initial offset); the alphabetical letter B is assigned to Current Offset value 0011; the alphabetical letter C is assigned to Current Offset value 0100; and the alphabetical letter D is assigned to illegal incoming data block values. Given these alphabetical assignments, FIG. 2 is a tree diagram showing Current Offsets for each of the incoming data blocks in the DATA column of Table 1.

In general, following a sequence through a tree structure requires storing all the previous bits to locate the position in the tree. However, in the tree of FIG. 2, the Current Offset and the current bit perform the role of "storing" the previous bits. Moreover, it is to be noted that, with the incoming data block values ordered sequentially in the manner shown in Table 1, the Current Offset values increase monotonically. Such being the case, it is possible to construct a new table such as that of Table 2. Table 2 has three inputs: the current data bit; the bit position number; the Current Offset. The output of Table 2 is one of three things: (1) no change to the offset; (2) a new offset; or (3) an indication that no more offsets are needed because the offset has been entirely determined by what has been received already.

Figure 2:
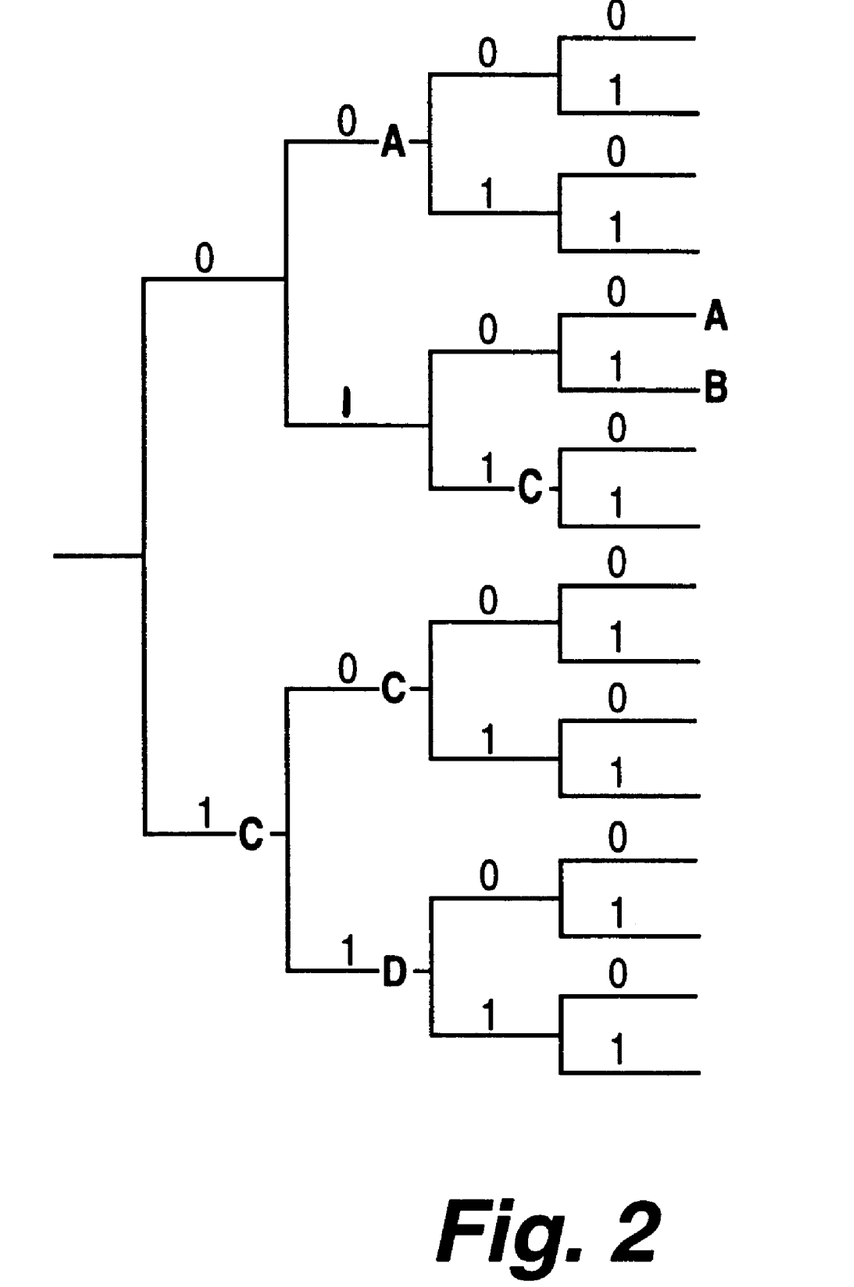
FIG. 2 is a diagrammatic view of a tree showing Current Offsets for incoming data blocks listed in Table 1.

As in illustration of employment of Table 2, and with reference to FIG. 2, assume that the incoming data block to be encoded is the sequence 0101 shown in Table 1. As shown in Table 1, the input sequence 0101 has the Current Offset 0011 (alphabetically represented by the letter "B") and the Modified Data value of 1000. In Table 2, it will be seen that the first arriving bit (i.e., bit position 3) is the leading 0 in the sequence 0101, and the Current Offset is A. With these three values known [bit position (BP), bit value (IP), and Current Offset], the Output OP (i.e., the new offset) can be determined from Table 2. Taking next the second bit of the input sequence 0101, i.e., the first "1" bit in bit position 2, since the Current Offset is still A, the Output (new offset) remains "A". In processing the third bit position (bit position 1) of the sequence 0101, the second zero is the input bit value, which means that Table 2 outputs again the new Offset "A". However, upon entry of the last bit position (bit position 0) with its bit value of "1", the output (new Offset) is B, and the encoding is indicated as being done. Thus, Table 2 shows how the three inputs of Bit Position (BP), bit input value (IP), and Current Offset can be utilized for a monotonically increasing offset scheme to obtain a new Offset (OP).

Figure 3:
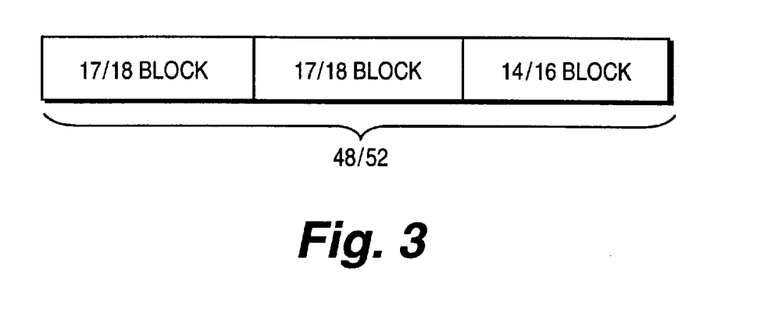
FIG. 3 is a diagrammatic view of a 48/52 code realized by three separate block codes.

As an example implementation of the principles described above, an encoder/decoder (ENDEC) according to the present invention processes a 48/52 rate code using three separate block codes, as illustrated in FIG. 3. The three constituent block codes are a 17/18 block code, followed by another 17/18 block code, followed by a 14/16 block code. When these three block codes are taken as a whole, the overall rate is 48/52. The ENDEC of the present invention operates on NRZI data, and therefore assumes that NRZI data is input thereto.

Figure 4:
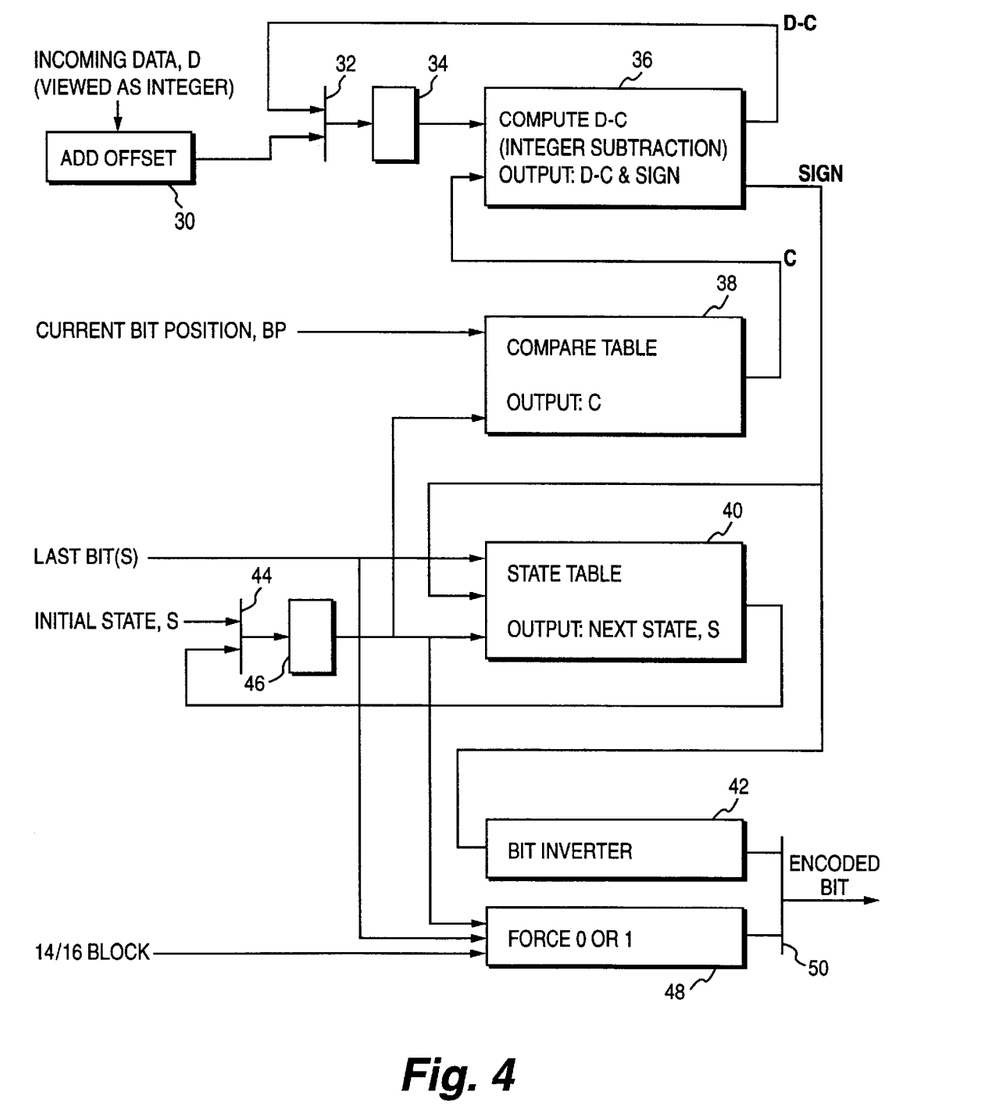
FIG. 4 is a schematic view of an encoder portion of an ENDEC according to an embodiment of the present invention.

FIG. 4 shows an encoder portion of the ENDEC according to an embodiment of the present invention. In the encoder of FIG. 4, an incoming data block D, viewed as an integer, is applied to an Add Offset unit 30. The output of the Add Offset unit 30 is then applied to a main stage of the encoder, which comprises the remaining elements illustrated in FIG. 4.

The main stage of the encoder of FIG. 4 functions in the manner above-described with reference (for example) to the trellis of FIG. 8. The main stage of the encoder of FIG. 4 comprises a multiplexer or MUX 32. A first input to MUX 32 is connected to the output of Add Offset unit 30. An output of the MUX 32 is applied to an input terminal of register 34. An output terminal of register 34 is connected to a first input of Subtraction Unit 36, so that the value D is applied as a first factor to Subtraction Unit 36. A second input terminal of Subtraction Unit 36 is connected to a Compare Table Unit 38. The Compare Table Unit 38 outputs a value C, which is applied as a second factor to Subtraction Unit 36, so that Subtraction Unit 36 can take the difference of factors D and C (i.e., perform the subtraction D-C). The subtraction result obtained from Subtraction Unit 36 is applied to a second input terminal of MUX 32. The sign of the subtraction result from Subtraction Unit 36 is applied both to State Table Unit 40 and to Bit Inverter 42.

The main stage of the encoder of FIG. 4 receives, in addition to the value D output from Add Offset unit 30, a current bit position of the incoming data block (BP); an initial state value; a last bit(s) signal; and a 14/16 block indicator signal. The initial state value is applied as a first input to a MUX 44. An output of MUX 44 is applied to an input of register 46. An output of register 46 is applied as a second input to State Table Unit 40 (the first input being the sign value output by Subtraction Unit 36). A third input to State Table Unit 40 is the last bit(s) signal. The last bit(s) signal and the output of register 46 are also applied as inputs to a Force 0 or 1 Unit 48, as is the 14/16 block indicator signal. A MUX 50 selects between the output of Bit Inverter 42 and Force 0 or 1 Unit 48, and outputs the selected value as an encoded bit.

The main stage of the encoder of FIG. 4 operates in accordance with clock cycles, outputting one bit of the encoded output for each clock. The MUX 32 is set to load the incoming data from Add Offset unit 30 on the first clock of operation of the main stage, and to load the subtraction result from Subtraction Unit 36 to register 34 on all subsequent clocks. The register 34 is enabled for the first clock, and is also enabled for any other clock where the sign bit output from Subtraction Unit 36 is zero.

In the encoder of FIG. 4, the sign output of Subtraction Unit 36 is "1" for a negative number. The Bit Inverter 42 inverts the sign bit in order to obtain the next encoded output bit. The encoded output bit is thus not the sign for all cases where more than one paths leaves a state. If only one path leaves a state, the output is always zero, except for the last bit of the 14/16 code. If only one path leaves a state, the encoder of FIG. 4 forces the output to a correct value using Force 0 or 1 Unit 48.

The initial state for the encoder of FIG. 4 is always the same, so that (if desired) register 46 could be built to load this initial value when reset. In such case, MUX 44 would be unnecessary, with register 46 instead being reset for the first clock, and enabled to receive the output of State Table Unit 40 for each subsequent clock.

In the encoder of FIG. 4, the values for C and D-C are 17 bit values for the 17/18 blocks, and 14 bits for the 14/16 block. The value for BP (Current Bit Position) is five bits for the 17/18 blocks, and four bits for the 14/16 block. The value for S (initial state) is three bits for the 17/18 blocks and four bits for the 14/16 block.

Thus, the encoder of FIG. 4 comprises Add Offset unit 30 which obtains an offset value for the incoming data block (the input value to the Add Offset Unit 30), and adds the offset value to the incoming data block to obtain an offset input value or modified input value. The offset input value is applied (via MUX 32) to the encoder main stage.

The encoder main stage encodes the offset input value to obtain the output data sequence (output from MUX 50).

Figure 5:
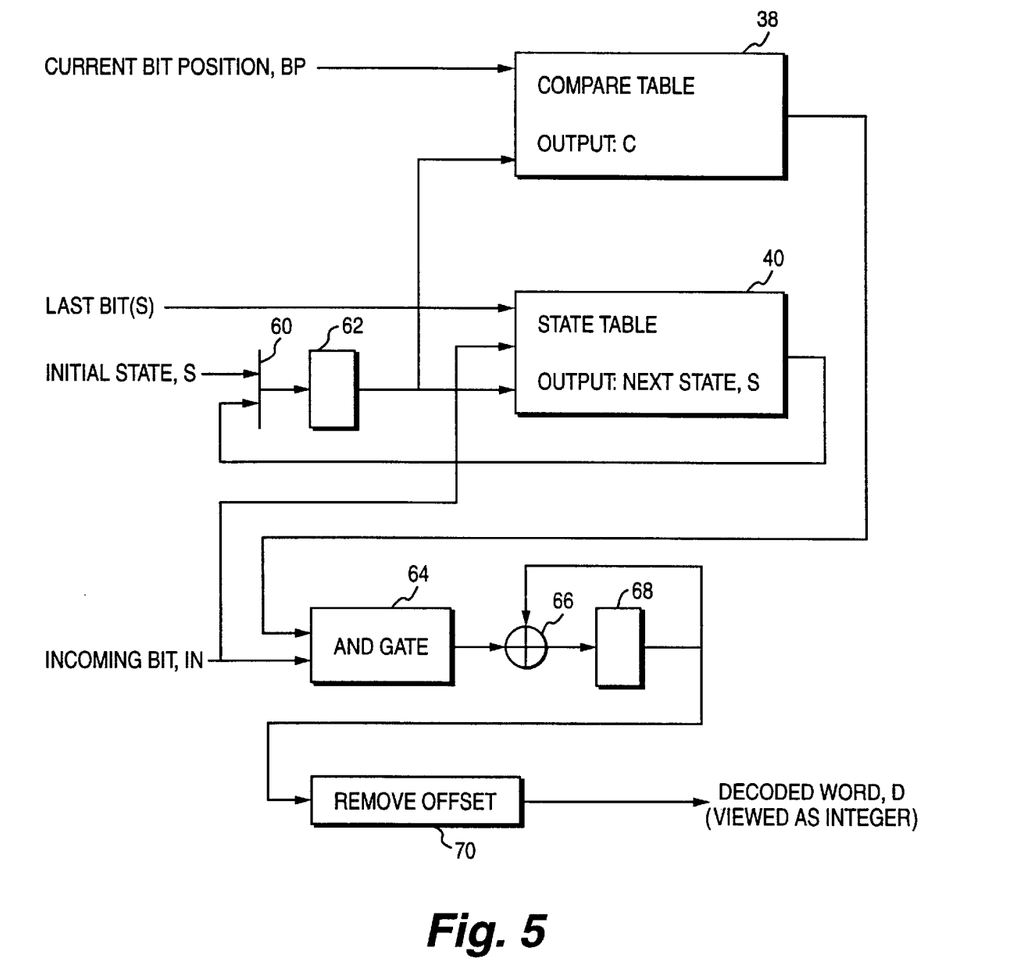
FIG. 5 is a schematic view of a decoder portion of an ENDEC according to an embodiment of the present invention.

FIG. 5 shows a decoder portion of the ENDEC according to an embodiment of the present invention. The decoder of FIG. 5 has a main stage which is followed by Remove Offset unit 70. The decoder of FIG. 5 comprises the same Compare Table Unit 38 and State Table Unit 40 as included in the encoder of FIG. 4, as well as MUX 60; register 62; AND gate 64; adder 66; and register 68. The inputs to the decoder of FIG. 5 are the Current Bit Position (BP); the last bit(s) signal; the initial state value; and the incoming bit value (IN). The incoming bit value (IN) is applied both to a first input terminal of AND gate 64 and to the State Table Unit 40. The Initial State value is applied as a first input to MUX 60. The output of MUX 60 is applied to register 62, whose output is in turn applied both to State Table Unit 40 and to Compare Table Unit 38. The output of State Table Unit 40, i.e., the next state (S), is applied to a second input terminal of MUX 60, so that after the first clock the MUX 60 selects the output of State Table Unit 40 for application to register 62. The output of Compare Table Unit 38 is applied as a second input to AND gate 64. The output of AND gate 64 is applied to a first input terminal of adder 66. The output terminal of adder 66 is connected to register 68. The contents of register 68 are applied both to a second input terminal of adder 66, and to Remove Offset Unit 70.

The decoder portion of the ENDEC as shown in FIG. 5 thus comprises a decoder main stage which receives an encoded data sequence and generates an at least partially decoded sequence therefrom. The at least partially decoded sequence is applied as the output of register 68 to the remove offset unit 70. The remove offset unit 70 forms a decoded codeword by removing an offset value from the at least partially decoded sequence.

The Compare Table Unit 38 of both the encoder of FIG. 4 and the decoder of FIG. 5 is taken from the encoding/decoding trellises, such as that illustrated for the 17/18 block code in FIG. 8. In conjunction with the encoder of FIG. 4, Compare Table Unit 38 is used to "take apart" an integer in order to create a codeword. In conjunction with the decoder of FIG. 5, Compare Table Unit 38 is used to "put together" an integer from a series of encoded bits.

The value of C output from Compare Table Unit 38 depend on the inputs of the Current Bit Position (BP) and the state. As evident from FIG. 8, the numbers in any column of the trellis for the 17/18 block are all the same (except for a possible zero entry when only one path leaves a state). This phenomena simplifies the ENDEC for the 17/18 block. The numbers in any column of the 14/16 block are sometimes the same and sometimes different. Awareness of this fact also simplifies the ENDEC.

The State Table Unit 40 of both the encoder of FIG. 4 and the decoder of FIG. 5 is a map that says where paths go from a given state. In the 17/18 block code, the output of State Table Unit 40 is only a function of the Current State until the last bit. For the 14/16 code, the output of State Table Unit 40 is only a function of the Current State until the last two bits. In other words, in most cases the State Table Unit 40 does not need to know the current bit position because the paths leaving any state are the same from one bit to the next. For these special cases just mentioned, however, it can be seen from their trellises that a few paths are removed in the last and next to last bits.

The construction of State Table Unit 40 can be simplified since the encoder of FIG. 4 always starts in the same state. This means that there is no point in computing the state after the last bit. Thus, for the 17/18 code, there is really no special case to worry about since it only affects the final state. For the 14/16 code, on the other hand, the next to last bit must be handled specially, where two paths are removed.

The values in the State Table Unit 40 can also be read from the trellises for the block, such as the trellis of FIG. 8 for the 17/18 block. Each state is given a number, then a table of next states is created based on the current state and the sign bit of the D-C comparison (for encoding) or the incoming bit (for decoding). When only one path leaves a state, the compare value (when encoding) or the incoming bit (when decoding) is ignored.

As shown in FIG. 4, the offset of the invention is added to an incoming data block prior by Add Offset unit 30 to the main stage of encoding. Conversely, as shown in FIG. 5, the offset of the invention is removed by Remove Offset Unit 70 from an at least partially decoded sequence after the main stage of decoding. In the illustrated embodiment, the Add Offset unit 30 and Remove Offset Unit 70 may have the same constituency, and for that reason are hereinafter collectively referenced as the Offset Unit. As explained below, the Offset Unit can be realized in several ways.

In a first embodiment, the Offset Unit is a look up table (such as that exemplified by Table 1) wherein each input value is an address, and the output of the table is the offset for that input value added to or subtracted from the input value. For an encoder, the input value is the incoming data block and the table outputs the sum. For a decoder the input value is the partially decoded sequence obtained from the decoder main stage and the table outputs the difference. For a 17/18 block code, such table would have $2^{17}$ inputs and $2^{17}$ outputs. In view of the undesirable size of such a table, in a variation of this first embodiment the output of the look up table could alternatively be just the offset for the input value, with the offset being added or subtracted externally to the table to the input value to obtain the resultant offset (i.e., offset input value or decoded codeword). In such variation, the number of outputs to the lookup table is not $2^{17}$, but is instead the number of unique offsets encompassed in the coding scheme. In one implementation, the number of unique offsets is no more than 256. Thus, the offset table for the variation of the first embodiment has $2^{17}$ inputs and 256 outputs for the 17/18 block code, and $2^{14}$ inputs and 256 outputs for the 14/16 block code.

Figure 6:
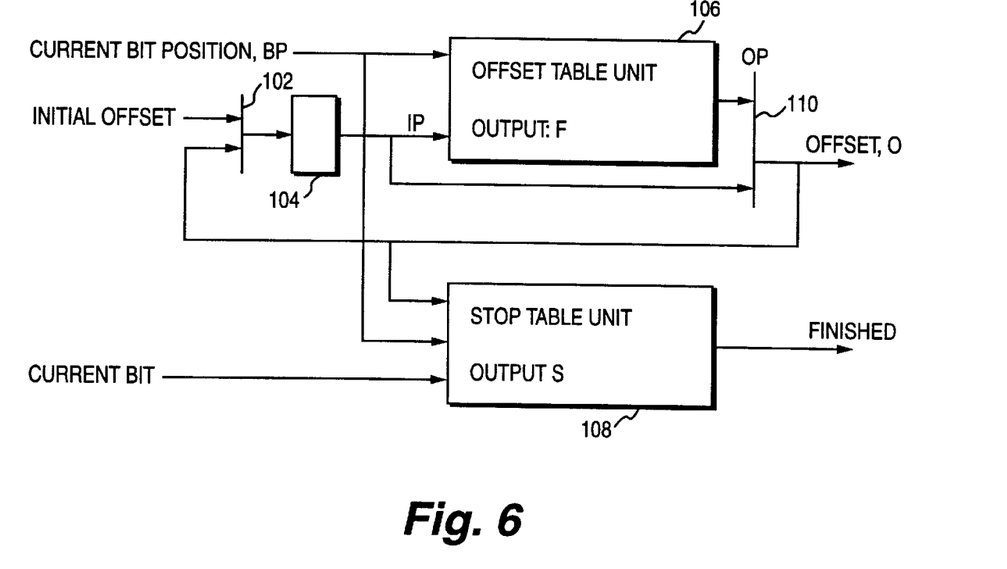
FIG. 6 is a schematic view of an offset unit according to one embodiment of the invention.

A second embodiment of the Offset Unit of the present invention, illustrated as Offset Unit 100 in FIG. 6, can be used for the Add Offset unit 30 of FIG. 4 and the Remove Offset Unit 70 of FIG. 5. Again, for an encoder, the input value is the incoming data block and for a decoder the input value is the partially decoded sequence obtained from the decoder main stage. The Offset Unit 100 of FIG. 6 employs a sequential method (i.e., sequentially ordered offset values). The second embodiment of the Offset Unit builds up the offset by operating on the input value one bit at a time. The Offset Unit 100 of FIG. 6 comprises a MUX 102; a register 104; an Offset Table Unit 106; a Stop Table Unit 108; and MUX 110. The Offset Table Unit 106 receives as inputs a current bit position value (BP) and an input value (IP), and outputs an output value (OP). The Offset Unit 100 selects between the output value (OP) outputted by Offset Table Unit 106 and the input value (IP) for outputting as an Offset Output (O). The input value (IP) is stored in register 104, and is selected by MUX 102 to be one of an initial offset value and the Offset Output (O). The Stop Table Unit 108 receives as inputs the Offset Output (O), the current bit position (BP), and the Current Bit value, and outputs a Finished signal when the final Offset Output (O) has been determined (i.e., when the operation is completed, e.g., when the offset has been completely "built up").

In the Offset Unit 100 of FIG. 6, register 104 takes the initial offset before the encoding or decoding operation begins (i.e., before the first clock), and then it takes as feedback from MUX 110 for the remainder of the calculations (the remaining clocks). The MUX 110 is controlled by the current bit. If the current bit is 1, then MUX 110 is set to take the output OP from Offset Table Unit 106. If the current bit is 0, then the Offset Output (O) does not change, since the MUX 110 is set to take the value of 0 of the previous clock time.

The Offset Unit of FIG. 6 works the same for both encoding and decoding operations, but the tables employed are different for encoding and decoding. Since there are two different code blocks operated on by Offset Unit 100 (i.e., 17/18 and 14/16 code blocks), and each code block requires two tables, the Offset Unit 100 of FIG. 6 requires a total of four tables, each with up to 256 outputs. Table 3 is the Offset Table for Offset Table Unit 106 for encoding for the 17/18 code. The person skilled in the art can construct a comparable Offset Table for decoding the 17/18 code, as well as tables for encoding and decoding the 14/16 code. Table 4 is an example of an elimination list, being particularly an elimination list for the 17/18 code of the illustrated embodiment. Similarly, Table 5 is an elimination list for the 14/16 code. It should be understood that these particular tables are only examples, and that the invention is not confined to any particular codes or any particular tables.

Figure 7:
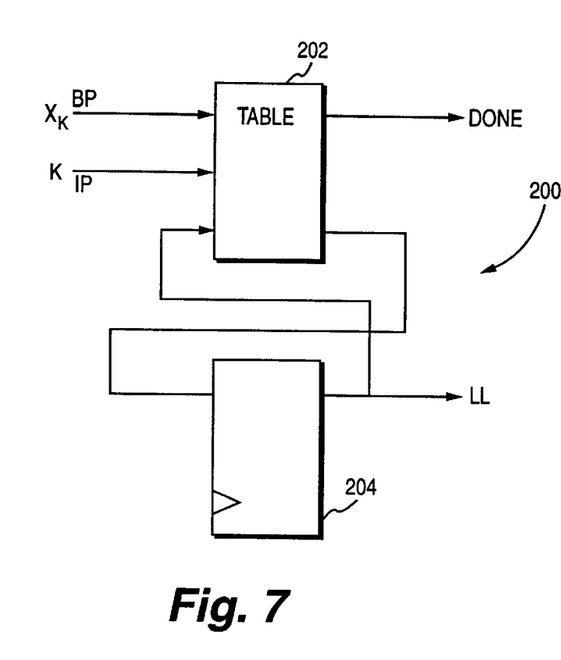
FIG. 7 is a schematic view of an offset unit according to another embodiment of the invention.

A third embodiment of the Offset Unit of the present invention, illustrated as Offset Unit 200 in FIG. 7, can be used for the Add Offset unit 30 of FIG. 4 and the Remove Offset Unit 70 of FIG. 5. The Offset Unit 200 comprises a Table Unit 202 which receives as inputs a bit position value (BP), a Current Bit value (IP), and a Current Offset (LL), and which outputs a New Offset and a "DONE" signal when the final Offset for the incoming data block has been determined. The New Offset is applied to a register 204, and output therefrom as the Current Offset (LL) for application to the Table Unit 202 and as the final offset output when the DONE signal indicates that the final offset has been computed. This third embodiment featuring Offset Unit 200 is based upon the principles undergirding Table 2.

The particular logic implemented by the elements shown in FIG. 5, FIG. 6, and FIG. 7 can be realized in hardware (e.g., by circuitry), or by firmware (e.g., coded instructions executable by a processor). In fact, each of the table units shown herein can comprise a memory addressable by a processor with the indicated inputs for obtaining the corresponding indicated outputs.

The offset technique of the present invention pertains to various types of encoder and/or decoder, and is not confined to enumerative or trellis coding systems, nor to the particular block size coding schemes (17/18 and 14/16) described herein.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

TABLE 1

Example OFFSET Table

| DATA | ELIMINATION LIST | MODIFIED DATA | CURRENT OFFSET |
|---|---|---|---|
|  | 0000 |  |  |
| 0000 |  | 0001 | 0001 |
| 0001 |  | 0010 | 0001 |
| 0010 |  | 0011 | 0001 |
| 0011 |  | 0100 | 0001 |
| 0100 |  | 0101 | 0001 |
|  | 0110 |  |  |
|  | 0111 |  |  |
| 0101 |  | 1000 | 0011 |
|  | 1001 |  |  |
| 0110 |  | 1010 | 0100 |
| 0111 |  | 1011 | 0100 |
| 1000 |  | 1100 | 0100 |
| 1001 |  | 1101 | 0100 |
| 1010 |  | 1110 | 0100 |
| 1011 |  | 1111 | 0100 |
| 1100 |  | illegal |  |
| 1101 |  | illegal |  |
| 1110 |  | illegal |  |
| 1111 |  | illegal |  |

TABLE 2

| Bit Position (Counting Down) | Current Bit | Current Offset | Output (new offset) |
|---|---|---|---|
| 3 | 0 | A | A |
| 3 | 1 | A | C |
| 2 | 0 | A | done: A |
| 2 | 0 | C | done: C |
| 2 | 1 | A | A |
| 2 | 1 | C | done: illegal input |
| 1 | 0 | A | A |

TABLE 2-continued

| Bit Position (Counting Down) | Current Bit | Current Offset | Output (new offset) |
|---|---|---|---|
| 1 | 1 | A | done: C |
| 0 | 0 | A | done: A |
| 0 | 1 | A | done: B |

What is claimed is:

1. An encoder which receives an incoming data block and which generates an output data sequence therefrom, and which avoids generating an undesirable output data sequence by adding an offset value to the incoming data block if the incoming data block is not less than a problematic input value, the problematic input value being a value which would encode to an undesirable output sequence.

2. The encoder of claim 1, comprising:
an add offset unit which adds the offset value to the incoming data block to obtain an offset input value; and
an encoder main stage which encodes the offset input value to obtain the output id data sequence.

3. The encoder of claim 2, wherein the add offset unit includes a look up table which receives the incoming data block as an address and which outputs one of (1) the offset value for the incoming data block, and (2) the offset input value.

4. The encoder of claim 2, wherein the add offset unit builds up an offset value for the incoming data block as bits of the incoming data block are sequentially received, the add offset unit comprising an Offset Table Unit which receives the following two inputs: (1) a bit position value; (2) a selected value which is selected to be one of a previous output of the Offset Table Unit and a previous input to the Offset Table Unit, depending on a current bit value.

5. The encoder of claim 4, wherein the add offset unit further comprises a Stop Table Unit which generates a finished signal when the selected value reaches the offset value for an incoming data block, the Stop Table Unit receiving as inputs the bit position value, the selected value, and the current bit value.

6. The encoder of claim 2, wherein the add offset unit builds up an offset value for the incoming data block as bits of the incoming data block are sequentially received, the add offset unit receiving the following three inputs: (1) a bit position value; (2) a current bit value; and (3) a current offset value; and wherein the add offset unit uses the three inputs to generate a new offset value.

7. The encoder of claim 2, wherein the encoder has an elimination list comprising plural entries corresponding to undesirable incoming data blocks, and wherein for each entry on the elimination list there is a corresponding offset value which relates an entry on the elimination list to an offset input value.

8. The encoder of claim 7, wherein a first undesirable data block on the elimination list has a corresponding first offset value; wherein a second undesirable data block on the elimination list has a corresponding first offset value; and wherein incoming data blocks which are numerically between the first undesirable data block and the second undesirable data block are assigned the first offset value to be added thereto.

9. The encoder of claim 7, wherein the plural entries of undesirable data blocks are ordered sequentially in the elimination list, and wherein the corresponding offset values increase monotonically.

10. The encoder of claim 1, wherein the encoder applies an integer representative of the offset input value as an input to an enumerative coding main stage which employs a trellis scheme.

11. The encoder of claim 10, wherein the encoder utilizes one of a 17/18 and a 14/16 quadbit mod 2 code.

12. A decoder comprising:
a decoder main stage which receives an encoded data sequence and generates an at least partially decoded sequence therefrom;
a remove offset unit which forms a decoded codeword by removing an offset value from the at least partially decoded sequence, the offset value having been included to avoid encoding an undesirable data sequence.

13. The decoder of claim 12, wherein the remove offset unit includes a look up table which receives the at least partially decoded sequence as an address and which outputs one of (1) the offset value for the at least partially decoded sequence, and (2) a difference between an integer represented by the at least partially decoded sequence and the offset value.

14. The decoder of claim 12, wherein the remove offset unit builds up an offset value for the at least partially decoded sequence as bits of the at least partially decoded sequence are sequentially received, the remove offset unit comprising an Offset Table Unit which receives the following two inputs: (1) a bit position value; (2) a selected value which is selected to be one of a previous output of the Offset Table Unit and a previous input to the Offset Table Unit, depending on a current bit value.

15. The decoder of claim 14, wherein the remove offset unit further comprises a Stop Table Unit which generates a finished signal when the selected value reaches the offset value for the at least partially decoded sequence, the Stop Table Unit receiving as inputs the bit position value, the selected value, and the current bit value.

16. The decoder of claim 12, wherein the remove offset unit builds up an offset value for the at least partially decoded sequence as bits of the at least partially decoded sequence are sequentially received, the remove offset unit receiving the following three inputs: (1) a bit position value; (2) a current bit value; and (3) a current offset value; and wherein the remove offset unit uses the three inputs to generate a new offset value.

17. The decoder of claim 12, wherein the decoder has an elimination list comprising plural entries representing undesirable at least partially decoded sequences, and wherein for each entry on the elimination list there is a corresponding offset value which relates a particular undesirable sequence to a corresponding decoded codeword.

18. The decoder of claim 17, wherein a first undesirable sequence on the elimination list has a corresponding first offset value; wherein a second undesirable sequence on the elimination list has a corresponding second offset value; and wherein at least partially decoded sequences which are numerically between the first undesirable sequence and the second undesirable sequence are assigned the first offset value to be subtracted therefrom.

19. The decoder of claim 17, wherein the plural entries of undesirable sequences are ordered sequentially in the elimination list, and wherein the corresponding offset values increase monotonically.

20. The decoder of claim 11, wherein the decoder main stage is an enumerative main stage which employs a trellis scheme.

21. The decoder of claim 20, wherein the decoder utilizes one of a 17/18 and a 14/16 quadbit mod 2 code.

22. A method of encoding an incoming data block comprising:
adding an offset value to the incoming data block to obtain an offset input value if the incoming data block is not less than a problematic input value, the problematic input value being a value which would encode to an undesirable output sequence;
encoding the offset input value to obtain an output data sequence.

23. The method of claim 22, comprising mapping an undesirable input value to an offset input value, the undesirable input value corresponding to an incoming data block which without the mapping would be encoded to an undesirable output data sequence, the offset input value being offset by the offset value from the undesirable input value.

24. The method of claim 23, further comprising adding at least the offset value to an incoming data block which has a greater value than the incoming data block having the undesirable input value.

25. The method of claim 22, wherein the encoding comprises using a look up table which receives an incoming data block as an address and which outputs one of (1) the offset value for the incoming data block, and (2) the offset input value.

26. The method of claim 22, further comprising:
building up an offset value for the incoming data block as bits of the incoming data block are sequentially received;
using an Offset Table Unit for the encoding; and
receiving at the Offset Table Unit the following two inputs: (1) a bit position value; (2) a selected value which is selected to be one of a previous output of the Offset Table Unit and a previous input to the Offset Table Unit, depending on a current bit value.

27. The method of claim 26, further comprising:
using a Stop Table Unit for the encoding to generate a finished signal when the selected value reaches the offset value for an incoming data block, the Stop Table Unit receiving as inputs the bit position value, the selected value, and the current bit value.

28. The method of claim 22, further comprising:
building up an offset value for the incoming data block as bits of the incoming data block are sequentially received;
wherein the encoding comprises using an add offset unit which receives the following three inputs: (1) a bit position value; (2) a current bit value; and (3) a current offset value;
generating with the add offset unit a new offset value using the three inputs.

29. The method of claim 22, further comprising maintaining an elimination list comprising plural entries of undesirable input values, and wherein for each entry on the elimination list there is a corresponding offset value which relates the undesirable input value to an offset input value.

30. The method of claim 29, wherein a first undesirable input value on the elimination list has a corresponding first offset value; wherein a second undesirable input value on the elimination list has a corresponding first offset value; wherein the method further comprises adding the first offset to incoming data blocks which are numerically between the first undesirable input value and the second undesirable input value.

31. The method of claim 29, wherein the plural entries of undesirable input values are ordered sequentially in the elimination list, and wherein the corresponding offset values increase monotonically.

32. The method of claim 22, wherein the encoding comprises applying the offset input value as an input to an enumerative encoding main stage which employs a trellis scheme.

33. The method of claim 32, wherein the encoding utilizes one of a 17/18 and a 14/16 quadbit mod 2 code.

34. A method of decoding comprising:

receiving an encoded data sequence and generating therefrom an at least partially decoded sequence;

forming a decoded codeword by removing an offset value from the at least partially decoded sequence, the offset value having been included to avoid encoding an undesirable data sequence.

35. The method of claim 34, further comprising using a look up table which receives the at least partially decoded sequence as an address and which outputs one of (1) the offset value for the encoded data sequence, and (2) a difference between the at least partially decoded sequence and the offset value.

36. The method of claim 34, further comprising:

building up an offset value for the at least partially decoded sequence as bits of the at least partially decoded sequence are sequentially received;

receiving at an Offset Table Unit the following two inputs: (1) a bit position value; (2) a selected value which is selected to be one of a previous output of the Offset Table Unit and a previous input to the Offset Table Unit, depending on a current bit value.

37. The method of claim 36, further comprising:

using a Stop Table Unit to generate a finished signal when the selected value reaches the offset value for an encoded data sequence, the Stop Table Unit receiving as inputs the bit position value, the selected value, and the current bit value.

38. The method of claim 34, further comprising:

building up an offset value for the at least partially decoded sequence as bits of the at least partially decoded sequence are sequentially received;

receiving at a remove offset unit the following three inputs: (1) a bit position value; (2) a current bit value; and (3) a current offset value; and using the remove offset unit to generate a new offset value using the three inputs.

39. The method of claim 34, further comprising maintaining an elimination list comprising plural entries of undesirable values representing undesirable partially decoded sequences, and wherein for each entry on the elimination list there is a corresponding offset value.

40. The method of claim 39, wherein a first undesirable value on the elimination list has a corresponding first offset value; wherein a second undesirable value on the elimination list has a corresponding second offset value; and wherein the method further comprises subtracting the first offset from encoded data sequences which are numerically between the first undesirable value and the second undesirable value.

41. The method of claim 39, further comprising sequentially ordering the plural entries of undesirable values in the elimination list, and wherein the corresponding offset values increase monotonically.

42. The method of claim 34, further comprising generating the at least partially decoded sequence using an enumerative decoding main stage which employs a trellis scheme.

43. The method of claim 42, further comprising utilizing one of a 17/18 and a 14/16 quadbit mod 2 code.

* * * * *